United States Patent
Bot et al.

(10) Patent No.: US 11,036,909 B1
(45) Date of Patent: Jun. 15, 2021

(54) METHOD AND APPARATUS FOR DESIGNING MULTI-BOARD ELECTRICAL AND ELECTRONIC CIRCUITS

(71) Applicant: BQR Reliability Engineering Ltd., Rishon-Lezion (IL)

(72) Inventors: Yizhak Bot, Rishon-Lezion (IL); Alex Gonorovsky, Rishon-Lezion (IL); Isaac Rosenstein, Rishon-Lezion (IL)

(73) Assignee: BQR RELIABILITY ENGINEERING LTD., Rishon-Lezion (IL)

( * ) Notice: Subject to any disclaimer, the term of this patent is extended or adjusted under 35 U.S.C. 154(b) by 0 days.

(21) Appl. No.: 16/916,349

(22) Filed: Jun. 30, 2020

(51) Int. Cl.
  *G06F 30/333* (2020.01)
  *G06F 30/392* (2020.01)
(52) U.S. Cl.
  CPC .......... *G06F 30/333* (2020.01); *G06F 30/392* (2020.01)
(58) Field of Classification Search
  CPC .............................. G06F 30/392; G06F 30/333
  USPC .......................................... 716/110, 118, 119
  See application file for complete search history.

(56) References Cited

U.S. PATENT DOCUMENTS

| | | | |
|---|---|---|---|
| 6,195,629 B1 | 2/2001 | Bargh et al. | |
| 6,414,505 B1 | 7/2002 | Stauffer et al. | |
| 7,000,211 B2* | 2/2006 | Arnold | G06F 30/327 716/116 |
| 7,073,149 B2* | 7/2006 | Knol et al. | G06F 30/392 716/124 |
| 8,307,315 B2* | 11/2012 | Adya et al. | G06F 30/392 716/108 |
| 8,954,915 B2* | 2/2015 | Chan et al. | G06F 30/392 716/132 |
| 9,881,119 B1 | 1/2018 | Kukal et al. | |
| 9,881,120 B1 | 1/2018 | Ginetti et al. | |
| 9,934,354 B1 | 4/2018 | Kukal et al. | |
| 10,803,224 B2* | 10/2020 | Shah et al. | G06F 30/392 |

* cited by examiner

Primary Examiner — Sun J Lin
(74) Attorney, Agent, or Firm — The Roy Gross Law Firm, LLC; Roy Gross

(57) ABSTRACT

A method, system and computer program product, the method comprising: obtaining information of a circuit to be designed comprising two blocks, the information comprising: block components of the two blocks, information of connectors connecting the two blocks, information of a plurality of internal nets, each internal net connecting components within a same block, information of a plurality of external nets, each external net connecting a component to a connector; automatically generating a design of a merged block, the design comprising: a plurality of circuit components, comprising circuit components of the first block and the second block, each circuit component having a unique designator and an association to an original component; a plurality of internal circuit nets comprising a plurality of internal nets, each internal net associated with a unique designator and an association to a respective internal net designator, and a plurality of combined circuit nets based on the plurality of external nets, each external net connecting a component from the first block and a component from the second block; testing the design of the circuit based; and outputting results of the testing.

19 Claims, 8 Drawing Sheets

MERGE BLOCKS

New (Merged) Block:

Reference Designator: AB — 404

Part Number: AB

Catalog Number: Merge PCBs A1 and B1

Description: -

Parent Block: — 408
System    [Select]

Two Source Blocks: — 412
A1    [Select]

Prefix in new (merged) block:
RefDes: A1_ — 416    Net: A1_ — 420

— 424
B1    [Select]

Prefix in new (merged) block:
RefDes: B1_ — 428    Net: B1_ — 432

Connected Connectors:    [Settings]
— 436

| First Block: A1 | Second Block: B1 |
|---|---|
|  |  |

☐ Copy Stresses    [OK]    [Cancel]

FIG. 4

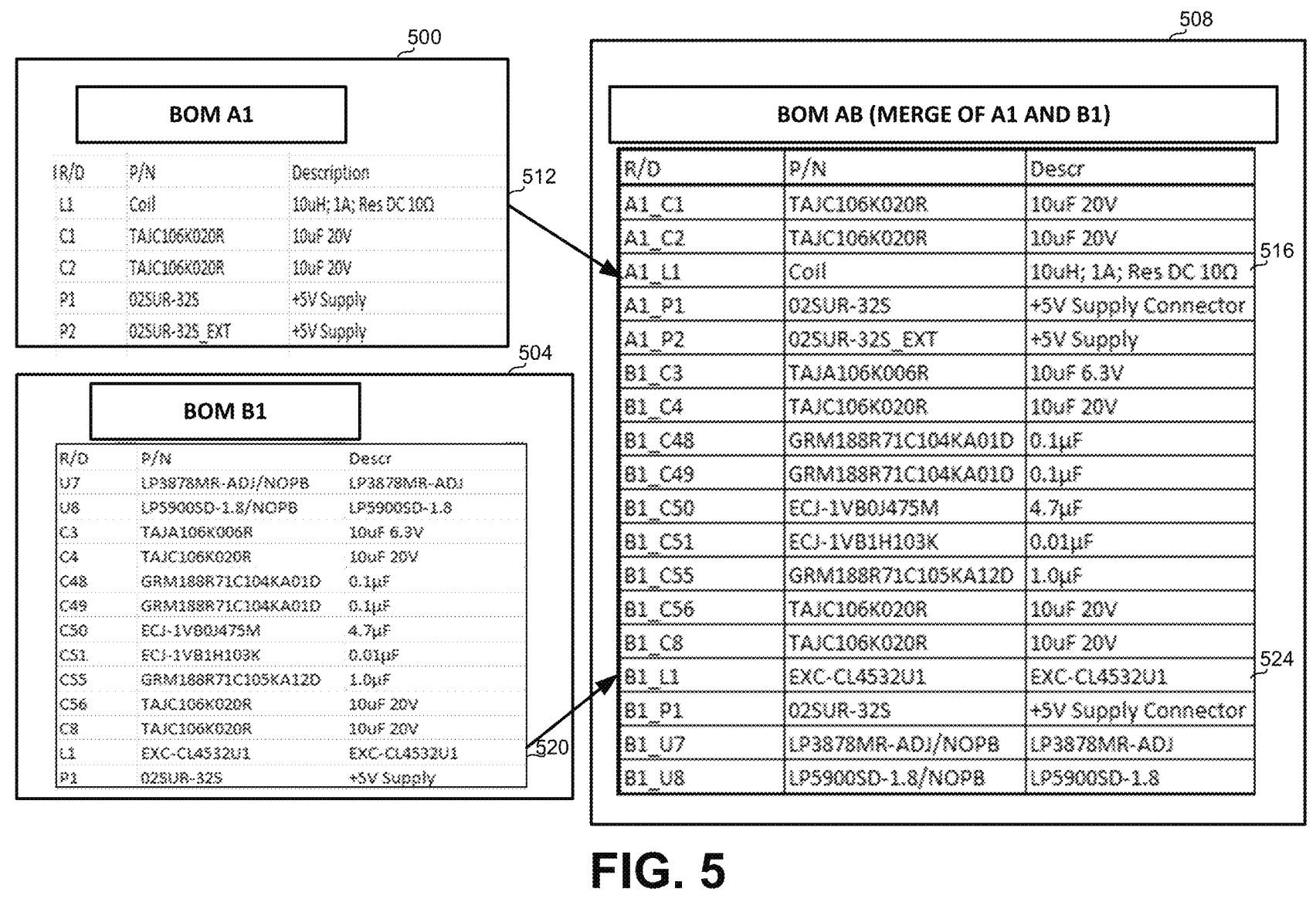

BOM A1 — 500

| R/D | P/N | Description |
|---|---|---|
| L1 | Coil | 10uH; 1A; Res DC 10Ω |
| C1 | TAJC106K020R | 10uF 20V |
| C2 | TAJC106K020R | 10uF 20V |
| P1 | 02SUR-32S | +5V Supply |
| P2 | 02SUR-32S_EXT | +5V Supply |

BOM B1 — 504

| R/D | P/N | Descr |
|---|---|---|
| U7 | LP3878MR-ADJ/NOPB | LP3878MR-ADJ |
| U8 | LP5900SD-1.8/NOPB | LP5900SD-1.8 |
| C3 | TAJA106K006R | 10uF 6.3V |
| C4 | TAJC106K020R | 10uF 20V |
| C48 | GRM188R71C104KA01D | 0.1µF |
| C49 | GRM188R71C104KA01D | 0.1µF |
| C50 | ECJ-1VB0J475M | 4.7µF |
| C51 | ECJ-1VB1H103K | 0.01µF |
| C55 | GRM188R71C105KA12D | 1.0µF |
| C56 | TAJC106K020R | 10uF 20V |
| C8 | TAJC106K020R | 10uF 20V |
| L1 | EXC-CL4532U1 | EXC-CL4532U1 |
| P1 | 02SUR-32S | +5V Supply |

BOM AB (MERGE OF A1 AND B1) — 508

| R/D | P/N | Descr |
|---|---|---|
| A1_C1 | TAJC106K020R | 10uF 20V |
| A1_C2 | TAJC106K020R | 10uF 20V |
| A1_L1 | Coil | 10uH; 1A; Res DC 10Ω |
| A1_P1 | 02SUR-32S | +5V Supply Connector |
| A1_P2 | 02SUR-32S_EXT | +5V Supply |
| B1_C3 | TAJA106K006R | 10uF 6.3V |
| B1_C4 | TAJC106K020R | 10uF 20V |
| B1_C48 | GRM188R71C104KA01D | 0.1µF |
| B1_C49 | GRM188R71C104KA01D | 0.1µF |
| B1_C50 | ECJ-1VB0J475M | 4.7µF |
| B1_C51 | ECJ-1VB1H103K | 0.01µF |
| B1_C55 | GRM188R71C105KA12D | 1.0µF |
| B1_C56 | TAJC106K020R | 10uF 20V |
| B1_C8 | TAJC106K020R | 10uF 20V |
| B1_L1 | EXC-CL4532U1 | EXC-CL4532U1 |
| B1_P1 | 02SUR-32S | +5V Supply Connector |
| B1_U7 | LP3878MR-ADJ/NOPB | LP3878MR-ADJ |
| B1_U8 | LP5900SD-1.8/NOPB | LP5900SD-1.8 |

FIG. 5

ME THOD AND APPARATUS FOR
DESIGNING MULTI-BOARD ELECTRICAL
AND ELECTRONIC CIRCUITS

TECHNICAL FIELD

The present disclosure relates to designing electronic circuits in general, and to a method and apparatus for assisting a designer of a multi-board circuit, in particular.

BACKGROUND OF THE INVENTION

In order to start the design of a circuit, a specification needs to be received, which states the functionality that the finished design needs to provide. However, the specification does not indicate how this functionality is to be achieved. The specification is essentially a technical description of what the finished circuit has to achieve, and can include a variety of electrical requirements, such as the input and output signals of the circuit, the available power supplies, permitted power consumption, or the like. The specification can also set some physical parameters that the design must meet, such as size, weight, moisture resistance, temperature range, thermal output, vibration tolerance, acceleration tolerance, or the like.

The design process includes transforming the specification into a plan that contains all the information required for physically constructing the circuit. The process normally includes several stages.

First, the specification is converted into a block diagram of the various functions that the circuit must perform, at which stage the contents of each block are not considered, but only what the block does. This approach allows for breaking a possibly complicated task into smaller tasks which may be handled one after the other, or divided amongst members of a design team.

Each block may then be studied in more detail. In particular, the details of the electrical functions of the block are considered.

Then, the specific circuit components are chosen to carry out each function of the overall design. At this stage the physical layout and electrical connections of each component are also determined. This stage is usually done using a graphic user interface, in which the layout of the circuit is designed. Each element may have a designator property, such as a name property, and during design, each element of the design may be assigned value for the name property, wherein the name property value comprises a character string. The value of the name property may be used for identifying the element, searching, or the like. The value of the name property may be assigned by the designer according to his or her choice. A default value may be assigned automatically to each unnamed element by the design software.

Typically, a design comprises a multiplicity of interconnected blocks, each of which may be implemented as a printed circuit boards.

The layout may then be tested, wherein testing may include connectivity verification of the design, followed by electrical simulation. Typically, testing starts with unit testing in which each block is tested independently of other blocks, wherein the signals input into a block are simulated. The unit testing phase may be followed by integration testing, in which two or more interconnected blocks are tested, such that the signals output by one block are input into another block.

Following testing and error correction, the resulting layout may be used for the production of a printed circuit board or Integrated circuit.

BRIEF SUMMARY OF THE INVENTION

One exemplary embodiment of the disclosed subject matter is a computer-implemented method comprising: obtaining information of a circuit being designed, the circuit comprising at least a first block and a second block, the information comprising: information of a first plurality of block components of the first block, a second plurality of block components of the second block, each component of the first plurality of block components and the second plurality of block components associated with a block-level designator, information of one or more connectors connecting the first block and the second block, information of a plurality of internal nets, each internal net from the plurality of internal nets connecting a first component and a second component, wherein the first component and the second component belong to the first plurality of block components, or the first component and the second component belong to the second plurality of block components, and wherein each net is associated with a block-level net designator, and information of a plurality of external nets, each external net from the plurality of external nets connecting a component from the first plurality of block components or the second plurality of block components to a connector from the connectors; automatically generating a design of a merged block, the design comprising: a plurality of circuit components, comprising the first plurality of block components and the second plurality of block components, wherein each component of the plurality of circuit components is associated with a unique designator and an association to the respective block-level designator, a plurality of internal circuit nets comprising the plurality of internal nets, wherein each internal circuit net of the plurality of internal circuit nets is associated with a unique net designator and an association to a respective block-level net designator, and a plurality of combined circuit nets based on the plurality of external nets, each combined circuit net of the plurality of combined circuit nets based on a first external net and a second external net from the plurality of external nets, wherein the first external net connects one or more components from the first block to one or more pins of a connector, and the second external net connects one or more components from the second block to the corresponding pin of the connector, the combined circuit net thereby connecting component from the first block and the component from the second block, the combined circuit net associated with a unique net designator and an association to the first external net and the second external net; testing the design of the circuit based on the plurality of circuit components, the plurality of internal circuit nets and the plurality of combined circuit nets, said testing comprising electric simulation, design rules checking and connectivity verification; and outputting results of schematic verification and electric simulation. Within the method, generating the design optionally comprises: receiving merging parameters for the first block and the second block; receiving merging indications for the connectors; generating the plurality of circuit components each of the plurality of circuit components associated with a component from the first block or the second block; and generating the plurality of internal circuit nets and the plurality of combined circuit nets, each of the plurality of internal circuit nets connecting two components from the first block or two components from the second block, and each of the plurality of external circuit nets connecting a component of the first block with a component of the second block through a connector from the connectors. Within the method, the unique designator of a component from the plurality of circuit components optionally comprises a name of a block the component belongs to, and the block-level designator of the component. Within the method, the unique designator optionally comprises a predefined character separator. Within the method, the unique net designator of a net from the plurality of internal circuit nets optionally comprises a name of a block the internal net belongs to, and the block-level net designator. Within the method the unique net designator of a net from the plurality of internal circuit nets optionally comprises a predefined character separator. Within the method, the unique net designator of a net from the plurality of combined circuit nets optionally comprises a designator of the first external net and a designator of the second external net. Within the method the unique designator of a net from the plurality of combined circuit nets optionally comprises a predefined character separator. Within the method, further blocks are optionally added incrementally to the design of the circuit.

Another exemplary embodiment of the disclosed subject matter is an apparatus having a processor, the processor being adapted to perform the steps of: obtaining information of a circuit being designed, the circuit comprising at least a first block and a second block, the information comprising: information of a first plurality of block components of the first block, a second plurality of block components of the second block, each component of the first plurality of block components and the second plurality of block components associated with a block-level designator, information of one or more connectors connecting the first block and the second block, information of a plurality of internal nets, each internal net from the plurality of internal nets connecting a first component and a second component, wherein the first component and the second component belong to the first plurality of block components, or the first component and the second component belong to the second plurality of block components, and wherein each net is associated with a block-level net designator, and information of a plurality of external nets, each external net from the plurality of external nets connecting a component from the first plurality of block components or the second plurality of block components to a connector from the connectors; automatically generating a design of a merged block, the design comprising: a plurality of circuit components, comprising the first plurality of block components and the second plurality of block components, wherein each component of the plurality of circuit components is associated with a unique designator and an association to the respective block-level designator, a plurality of internal circuit nets comprising the plurality of internal nets, wherein each internal circuit net of the plurality of internal circuit nets is associated with a unique net designator and an association to a respective block-level net designator, and a plurality of combined circuit nets based on the plurality of external nets, each combined circuit net of the plurality of combined circuit nets based on a first external net and a second external net from the plurality of external nets, wherein the first external net connects one or more components from the first block to one or more pins of a connector, and the second external net connects one or more components from the second block to the corresponding pin of the connector, the combined circuit net thereby connecting component from the first block and the component from the second block, the combined circuit net associated with a unique net designator and an association to the first external net and the second external net; testing the design of the circuit based on the plurality of circuit components, the plurality of internal circuit nets and the plurality of combined circuit nets, said testing comprising electric simulation, design rules checking and connectivity verification; and outputting results of schematic verification and electric simulation. Within the apparatus, the step of generating the design optionally comprises: receiving merging parameters for the first block and the second block; receiving merging indications for the connectors; generating the plurality of circuit components each of the plurality of circuit components associated with a component from the first block or the second block; and generating the plurality of internal circuit nets and the plurality of combined circuit nets, each of the plurality of internal circuit nets connecting two components from the first block or two components from the second block, and each of the plurality of external circuit nets connecting a component of the first block with a component of the second block through a connector from the connectors. Within the apparatus, the unique designator of a component from the plurality of circuit components optionally comprises a name of a block the component belongs to, and the block-level designator of the component. Within the apparatus, the unique designator optionally comprises a predefined character separator. Within the apparatus, the unique net designator of a net from the plurality of internal circuit nets optionally comprises a name of a block the internal net belongs to, and the block-level net designator. Within the apparatus, the unique net designator of a net from the plurality of internal circuit nets optionally comprises a predefined character separator. Within the apparatus, the unique net designator of a net from the plurality of combined circuit nets optionally comprises a designator of the first external net and a designator of the second external net. Within the apparatus, the unique net designator of a net from the plurality of combined circuit nets optionally comprises a predefined character separator. Within the apparatus, the steps are optionally repeated for incrementally adding further blocks to the design of the circuit.

Yet another exemplary embodiment of the disclosed subject matter is a computer program product comprising a non-transitory computer readable medium retaining program instructions, which instructions when read by a processor, cause the processor to perform a method comprising: obtaining information of a circuit being designed, the circuit comprising at least a first block and a second block, the information comprising: information of a first plurality of block components of the first block, a second plurality of block components of the second block, each component of the first plurality of block components and the second plurality of block components associated with a block-level designator, information of one or more connectors connecting the first block and the second block, information of a plurality of internal nets, each internal net from the plurality of internal nets connecting a first component and a second component, wherein the first component and the second component belong to the first plurality of block components, or the first component and the second component belong to the second plurality of block components, and wherein each net is associated with a block-level net designator, and information of a plurality of external nets, each external net from the plurality of external nets connecting a component from the first plurality of block components or the second plurality of block components to a connector from the connectors; automatically generating a design of a merged block, the design comprising: a plurality of circuit components, comprising the first plurality of block components and the second plurality of block components, wherein each component of the plurality of circuit components is associated with a unique designator and an association to the respective block-level designator, a plurality of internal circuit nets comprising the plurality of internal nets, wherein each internal circuit net of the plurality of internal circuit nets is associated with a unique net designator and an association to a respective block-level net designator, and a plurality of combined circuit nets based on the plurality of external nets, each combined circuit net of the plurality of combined circuit nets based on a first external net and a second external net from the plurality of external nets, wherein the first external net connects one or more components from the first block to one or more pins of a connector, and the second external net connects one or more components from the second block to the corresponding pin of the connector, the combined circuit net thereby connecting component from the first block and the component from the second block, the combined circuit net associated with a unique net designator and an association to the first external net and the second external net; testing the design of the circuit based on the plurality of circuit components, the plurality of internal circuit nets and the plurality of combined circuit nets, said testing comprising electric simulation, design rules checking and connectivity verification; and outputting results of schematic verification and electric simulation. Within the apparatus, the step of generating the design optionally comprises: receiving merging parameters for the first block and the second block; receiving merging indications for the connectors; generating the plurality of circuit components each of the plurality of circuit components associated with a component from the first block or the second block; and generating the plurality of internal circuit nets and the plurality of combined circuit nets, each of the plurality of internal circuit nets connecting two components from the first block or two components from the second block, and each of the plurality of external circuit nets connecting a component of the first block with a component of the second block through a connector from the connectors.

BRIEF DESCRIPTION OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIG. 4 shows an exemplary dialog for receiving from a user properties of blocks to be merged, in accordance with some embodiments of the disclosure;

FIG. 5 shows BOM tables for a first block, a second block and a merged bock, in accordance with some embodiments of the disclosure;

DETAILED DESCRIPTION OF THE INVENTION

Figure 1:
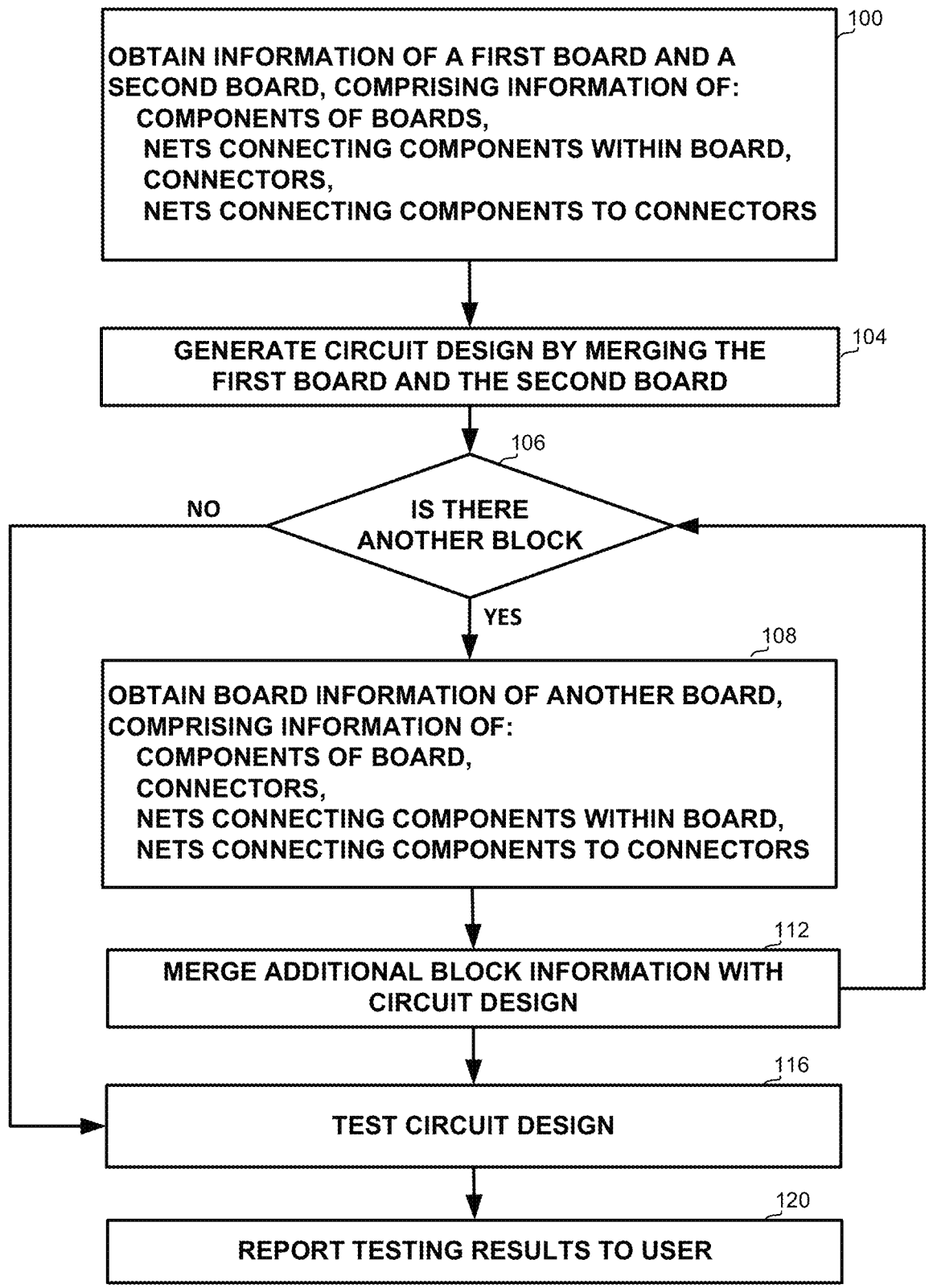
FIG. 1 shows a flowchart of steps in a method for testing a multi-block circuit, in accordance with some embodiments of the disclosure.

The term "block" or "board" used in this specification should be expansively construed to cover the design of any kind of a collection of components performing one or more functions. Once the design and testing is completed, a block or a board may be implemented as a printed circuit board (PCB). A PCB mechanically supports and electrically connects electrical or electronic components using conductive tracks, pads and other features etched from one or more sheet layers of copper laminated onto and/or between sheet layers of a non-conductive substrate. Components are generally soldered onto the PCB to both electrically connect and mechanically fasten them to it.

The term "Net" used in this specification should be expansively construed to cover any kind of Net, i.e., a node connecting one or more elements in an electronic circuit. A net may connect components within a same block, or a component of a block to a connector which may connect to another block.

Each component and each net in a circuit has a designating property, for example a name, which is typically assigned a string character as a value. In the disclosure below and unless stated otherwise, the terms "name", "value", "string character", "property", "net name" and "net name property", "component name" and "component name property" are used interchangeably to indicate a string character assigned as a value for the designating property of a net or a component.

One technical problem dealt with by the disclosed subject matter relates to the difficulties arising when performing integration automated testing, including for example electrical simulation and schematic verification, in which two or more blocks connected by a connector are to be tested together, such that a signal output by one block is input into the other block. When testing, a description of a single virtual block may be generated, which represents the merging of two or more separate blocks, for example for testing purposes.

One problem arising in this situation is the presence of multiple instances of components having identical designators, which is formed by testing together the two or more blocks. For example, if each of two blocks comprises a capacitor designated "C1", when merging the blocks it will not be possible to uniquely identify each of the two capacitors. This problem also applies to nets, when testing multiple blocks having nets with the same net designating property, wherein the nets are "internal nets", i.e. they connect components within the same block.

Another problem arising when testing multiple blocks relates to "external nets", i.e. nets connecting components from different blocks to each other, by each of the nets connecting to the corresponding pin of the corresponding connector. When testing multiple connected blocks, the external nets should be considered as a single net connecting components within the combined block, wherein the components originally belong to different blocks.

One technical solution provided by the disclosure comprises generating a description of a merged block combined from two or more blocks in a multi-block circuit. The description describes a virtual block, generated for example for testing purposes, and designed to simulate the combined functionalities of the merged blocks.

The combined description comprises all components of each of the two or more blocks, wherein each component is assigned or reassigned a unique value to a designating property, such as a name. The description also comprises the internal nets which connect elements within the same block of the circuit, such that each such net is assigned or reassigned a unique name and can be uniquely identified within the description.

Within the solution, for each component and each internal net that connects components within one block within the circuit, the designating property may include the designator property of the original block it belongs to, optionally a predetermined separator, and the original component designator property.

Each such component or internal net may also have a reference to the original component or net it was based upon.

Within the solution, the description may also comprise combined nets, wherein each such combined net is based on two or more external nets which connect components from different blocks, through a connector. Each such combined net is assigned a unique designating property and references to the two or more original external nets. It will be appreciated that since the merged block comprises all components of the two blocks being merged, the external nets are combined into an internal net of the merged block. Therefore, in order to enhance clarity, the nets within the merged block that are based on internal nets are termed internal nets, while the nets within the merged block that are based on combining external nets are termed external nets.

The description of the virtual block may then be tested, including verification and/or simulation, thus testing two or more interconnected blocks as part of integration testing.

Once a description of two merged blocks is created, further blocks may be merged, before or after testing the merged block. The merging may thus continue until all blocks in the circuit are merged.

One technical effect of the disclosure relates to a method and apparatus for generating a description of a virtual block which is electrically equivalent to the merging of two blocks, and enables the unique identification of each component and internal net in the merged block. The description also comprises combined nets, wherein each combined net connects components from two or more components belonging to two or more of the merged blocks.

Referring now to FIG. 1, showing a flowchart of a method for testing a multi-block circuit in accordance with the disclosure.

On step 100, block information of at least a first block and a second block may be received. The information may comprise for each block: a plurality of components contained in the block, also referred to as a bill of material (BOM), internal nets connecting components within the same block, connectors, and external nets connecting components to connectors, and thus to components of other blocks.

Figure 3A:
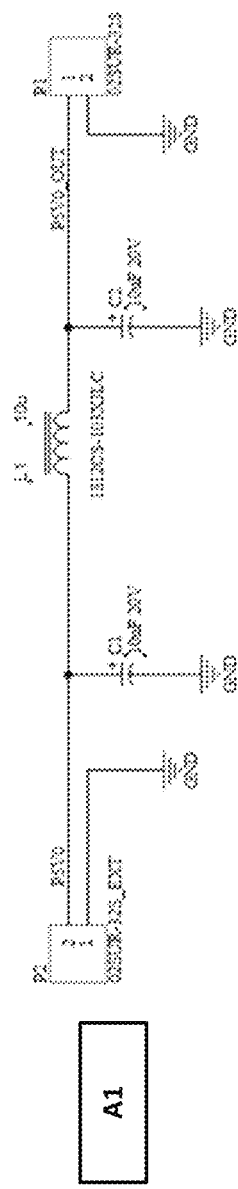
FIG. 3A shows an electronic scheme of a first block.
Figure 3B:
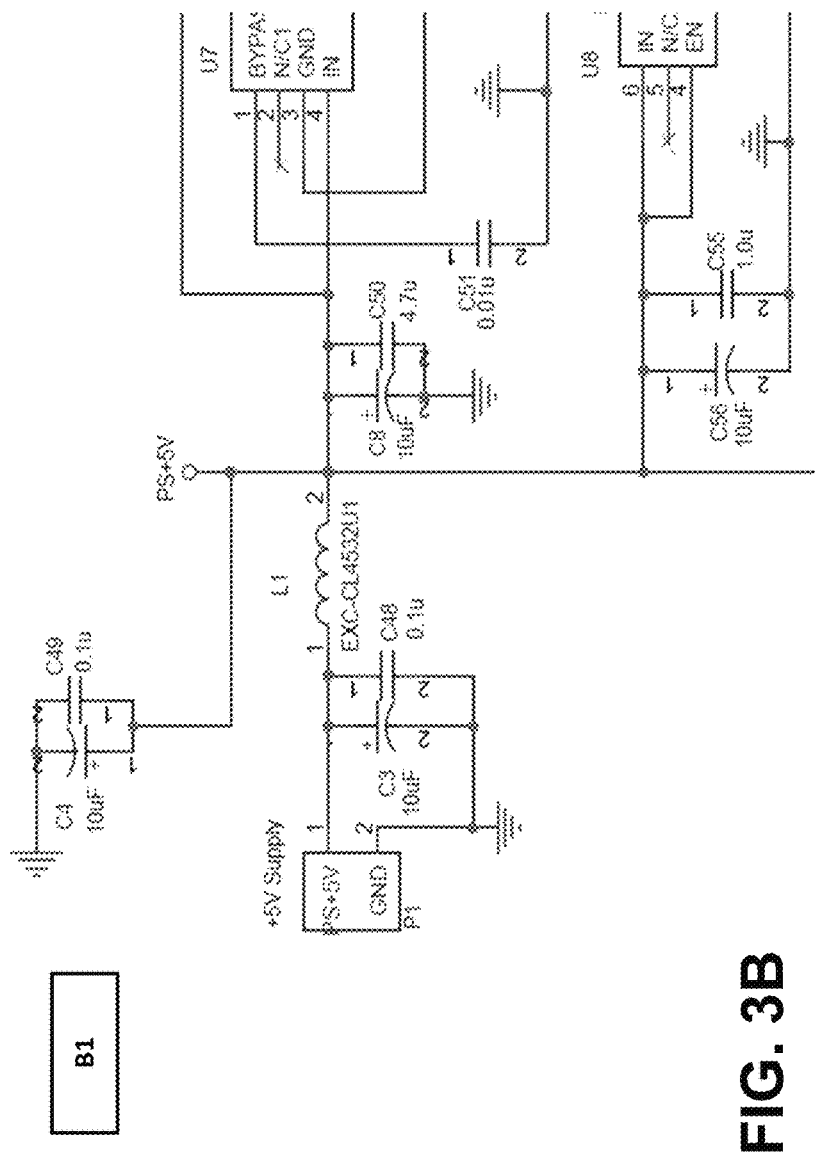
FIG. 3B shows an electronic scheme of a part of a second block.

FIG. 3A shows a first block A1, and FIG. 3B shows a part of a second block B1, wherein A1 and B1 are parts of the same circuit, which is to be tested. Table 500 of FIG. 5 shows the BOM of block A1, and table 504 shows the BOM of block B1.

On step 104, a circuit design is generated, based on merging the descriptions of the first block and the second block. Merging the blocks and generation of the design is further detailed in association with FIG. 2 below.

On step 106 it is determined whether the circuit comprises additional blocks to be merged. If the circuit comprises no further blocks, execution continues on testing step 116, where the circuit design may be tested, including connecting verification and/or electrical simulation.

On step 120, the testing results may be provided to a user, for example displayed on a display device, written to a file or a database, or the like. The testing results may indicate problems or warnings related to one or more uniquely identified components, and in particular components having instances in multiple blocks.

If the circuit does comprise an additional block, then on step 108 information of the additional block is obtained, similarly to the information obtained for the first and second blocks on step 100.

On step 112 the design comprising the previously merged blocks is further merged with the information of the additional block, thus incrementally generating the design of the full circuit.

Execution can then return to step 106 for determining wither additional blocks exist.

Figure 2:
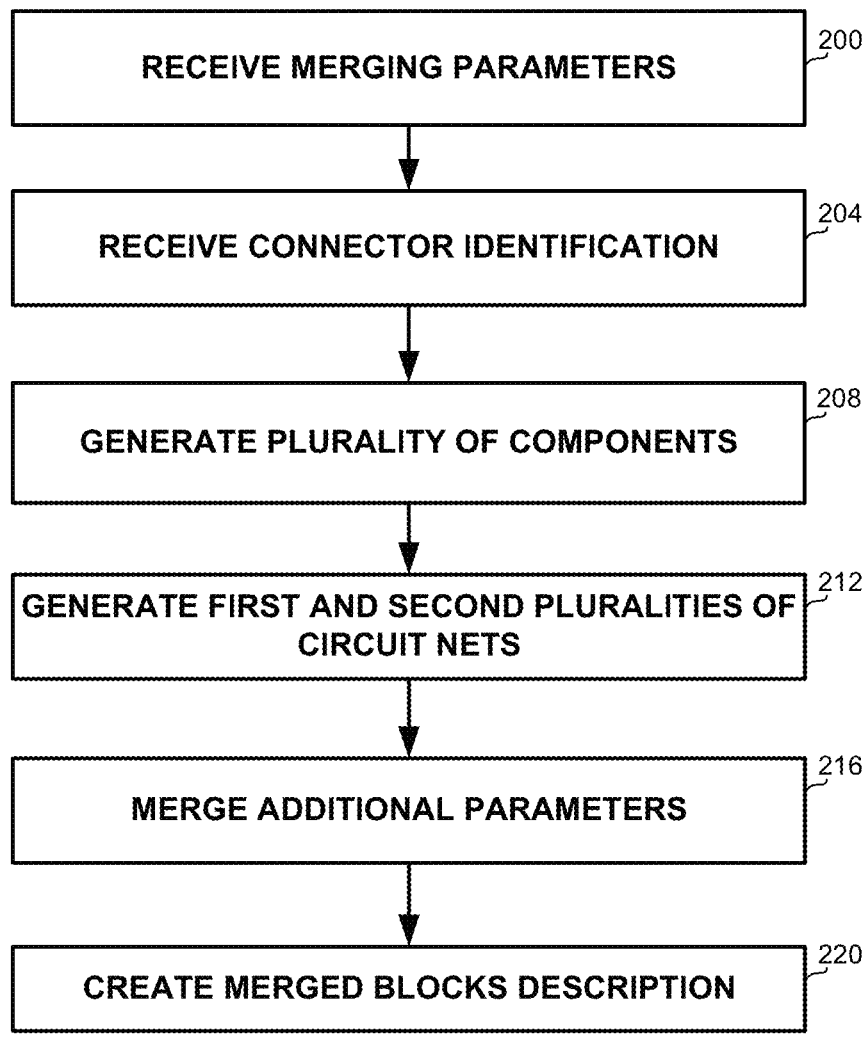
FIG. 2 shows a flowchart of the steps in a method for merging a first block and a second block, in accordance with some embodiments of the disclosure.

Referring now to FIG. 2, showing a flowchart of the steps in a method for merging a first block and a second block.

On step 200, properties of the merging of the blocks may be received, for example from a user using a dedicated user interface. Referring now to FIG. 4, showing an exemplary dialog 400 for receiving from a user properties of the blocks to be merged.

On field 404, the user may enter a reference designator for the combined block. In this example, the user entered "AB", since the combined blocks are A1 and B1. However, the designator is not limited and any character string may be selected.

On field 408 the user may indicate the parent block of the combined block.

On field 412 the user may indicate the first block to be combined. On fields 416 and 420 the user may enter prefixes to be used when generating unique names for the components and the internal nets, respectively, of the first block.

On field 424 the user may indicate the second block to be combined. On fields 428 and 432 the user may enter prefixes to be used when generating unique names for the components and the internal nets, respectively, of the second block.

It will be appreciated that any of the first block or the second block may in itself be a combined block.

Figure 6:
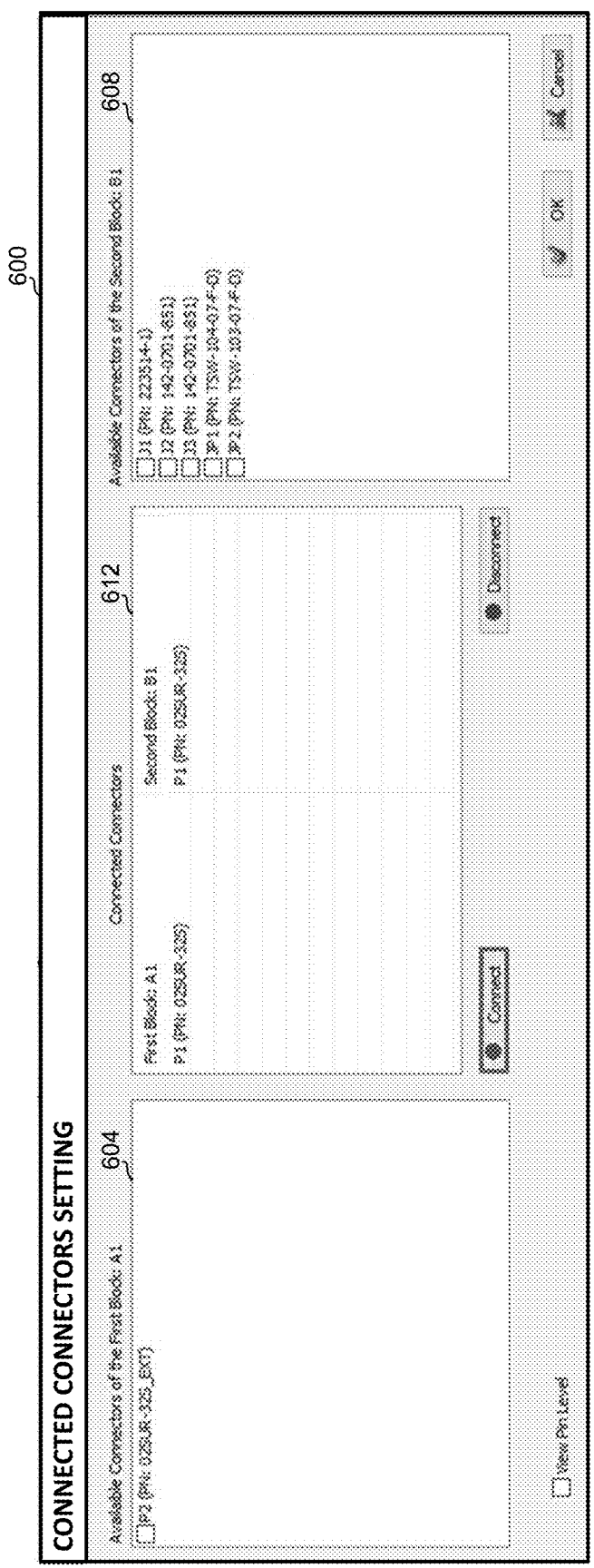
FIG. 6 shows an exemplary dialog for receiving from a user properties of blocks to be merged, in accordance with some embodiments of the disclosure.

On step 204, a connector from the two blocks being merged may be identified. Referring now to FIG. 6, showing an exemplary dialog 600 for receiving from a user properties of the connector pins to be merged.

Left pane 604 lists the connectors available for the first selected block. The pane shows only P2 although block A1 also comprises P1, since P1 has already been connected.

Right pane 608 lists the connectors available for the second selected block. The pane does not show P1 since it has already been connected.

Middle pane 612 shows the merging of P1 connector of A1 with P1 connector of B1, as selected by the user.

On step 208, a plurality of circuit components, wherein each component may be based on one of the components of the first block or the second block, having a designating property in accordance with the details provided by the user, as shown for example on FIG. 4 above.

Table 508 of FIG. 5 shows the combined BOM comprising the circuit components for the combined block, being block AB. It is seen that A1 contains L1 (512) and B1 contains L1 (520). In the combined block, an A1_L1 (516) has been formed based on L1 (512), and B1_L1 (524) has been formed based on L1 (520).

On step 212 new nets for the merged block are generated.

A first plurality of nets, termed "internal nets" are generated based on the internal nets existing in either block, which combine components within the block.

Figure 7:
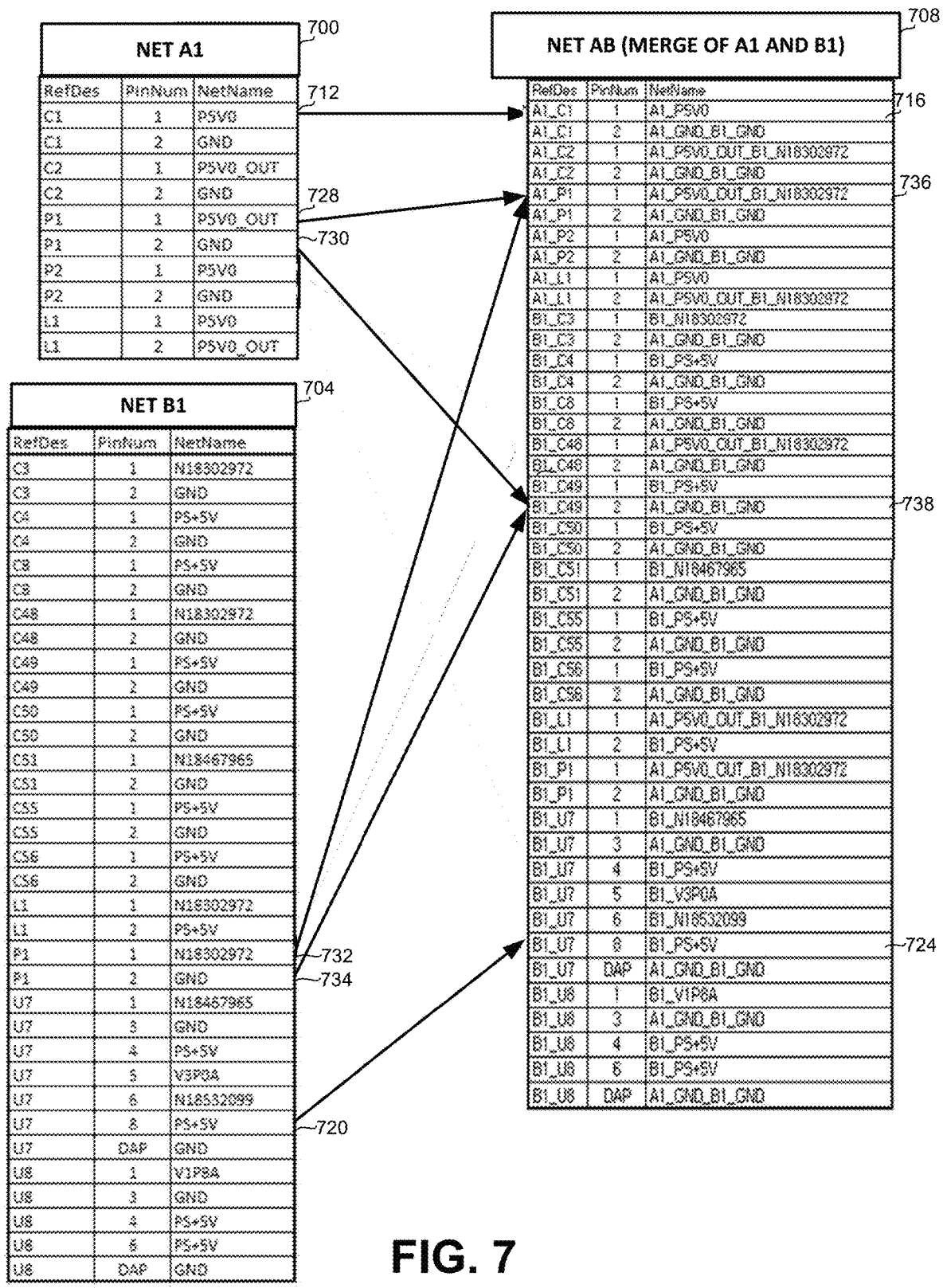
FIG. 7 is shows net tables for a first block, a second block and a merged bock, in accordance with some embodiments of the disclosure.

Referring now to FIG. 7, wherein Table 700 shows the nets of block A1, table 704 shows the nets of block B1, and table 708 shows the nets of merged block AB. It is seen that internal net 716 of block AB is formed based on internal net 712 of block A1 and is assigned an "A1" prefix and a "_" separator, and internal net 724 of block AB is formed based on internal net 720 of block B1 and is assigned an "B1" prefix and a "_" separator.

A second plurality of nets, termed combined nets, are generated by combining sets of two or more external nets that connect components from different blocks to the same pin of the same connector, as defined on step 204.

Referring now back to FIG. 7, combined net 736 of block AB is formed based on external net 728 of A1 and external net 732 of B1, and is assigned an "A1" prefix, a "_" separator a "B1" separator prior to the name of the net as taken form B1, and another "_" separator. Similarly, combined net 738 is based on external net 730 of A1 and external net 734 of B1 and is named accordingly.

On step 216, additional parameters of the blocks may be merged, which may include but is not limited to any one or more of merging integrated circuits (IC) libraries, merging parameters such as DC-to-DC conversion parameters, merging frequency characteristics, or the like.

On step 220, the description of the merged virtual block is created, comprising at least:

A plurality of circuit components, comprising components based on the first plurality of block components and the second plurality of block components, wherein each component of the plurality of circuit components is assigned a unique designator and an association to the respective block-level designator;

A first plurality of circuit nets, termed internal nets, comprising nets based on the internal nets of the merged blocks, wherein each net is associated with a unique net designator and an association to the respective block-level net designator; and A second plurality of circuit nets, termed combined nets, each associated with a unique net designator and an association to a first external net that connects a component of the first block to a connector on a first pin, and to an external second net that connects a component of the second block to the at least one pin of the connector.

Figure 8:
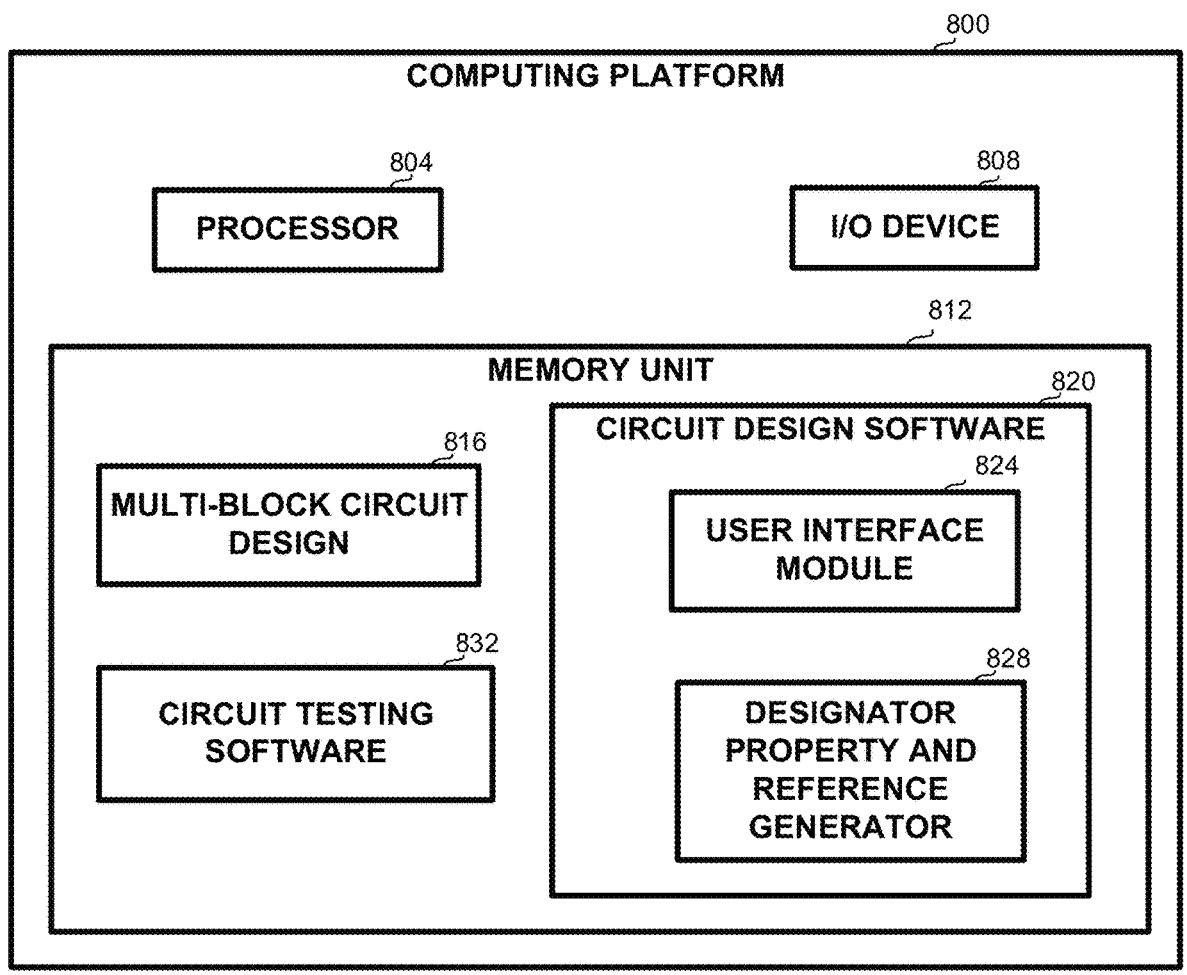
FIG. 8 shows a block diagram of a computing device configured for testing a multi-block circuit, in accordance with some exemplary embodiments of the disclosed subject matter.

Referring now to FIG. 8, showing a block diagram of a computing platform 800 for testing a multi-block circuit, in accordance with some exemplary embodiments of the disclosed subject matter.

In some exemplary embodiments computing platform 800 may comprise a processor 804, which may be a Central Processing Unit (CPU), a microprocessor, an electronic circuit, an Integrated Circuit (IC) or the like. Processor 804 may be utilized to perform computations required by computing platform 800 or any of it subcomponents. Processor 804 may be configured to execute computer-programs useful in performing the method of FIG. 1 and FIG. 2 above.

In some exemplary embodiments, one or more I/O devices 808 may be configured to receive input from and provide output to a user. In some exemplary embodiments, I/O devices 808 may be utilized to present to the user a user interface, obtain user input instructions useful for generating a value for a net name property, and display the value. I/O devices 808 may comprise a keyboard, a mouse, a touch screen or another tracking device, a voice activated device, or the like.

In some exemplary embodiments computing platform 800 may comprise a memory unit 812. Memory unit 812 may be a short-term storage device or long-term storage device. Memory unit 812 may be a persistent storage or volatile storage. Memory unit 812 may be a disk drive, a Flash disk, a Random Access Memory (RAM), a memory chip, or the like. Memory unit 812 may be a single memory device, or multiple interconnected memory devices which may be co-located or located in different locations and communicating via any communication channel.

In some exemplary embodiments, memory unit 812 may retain program code operative to cause processor 804 to perform acts associated with any of the subcomponents of computing platform 800. In some exemplary embodiments, memory unit 812 may retain program code operative to cause processor 804 to perform acts associated with any of the steps shown in FIG. 1 and FIG. 2 above.

Memory unit 812 may retain multi-block circuit design 816 for one or more multi-block circuits. The circuit design may have been created using circuit design software 820, imported from another storage device, or otherwise received. Multi-block circuit design 816 may also be stored on a memory unit or a database associated with another computing platform, which is in communication with computing platform 800. Multi-block circuit design 816 may also comprise the merged virtual circuit description generated in accordance with the disclosure.

The components detailed below may be implemented as one or more sets of interrelated computer instructions, executed for example by processor 804 or by another processor. The components may be arranged as one or more executable files, dynamic libraries, static libraries, methods, functions, services, or the like, programmed in any programming language and under any computing environment.

Memory unit 812 may retain circuit design software 820, such as any CAD software, designed for editing circuits. In addition to all conventional components of any CAD software, circuit design software 820 may comprise a user interface module 824, configured to display a user interface, such as the user interface shown on FIG. 4 or FIG. 6.

Circuit design software 820 may comprise designator property and reference generator 828 designed to generate designator properties and references for the components, internal nets and combined nets of the merged blocks, according to the components and internal and external nets of the two or more blocks being merged.

Memory unit 812 may retain circuit testing module 832, for testing the block description with the merged blocks, including for example verifying connectivity of the merged blocks and simulating the circuit with the merged blocks.

It will be appreciated that the method and apparatus can also be used for assigning values to the name property of other components, such that a user can select certain characteristics and/or enter text describing values for other one or more characteristics. A value can then be generated for the component using the selected or entered values in accordance with a predetermined scheme.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

This listing of the claims replaces all prior versions:

1. A method, comprising:
   obtaining information of a circuit being designed, the circuit comprising at least a first block and a second block, the information comprising:
   information of a first plurality of block components of the first block and of a second plurality of block components of the second block, each component of the first plurality of block components and the second plurality of block components associated with a block-level designator,
   information of at least one connector connecting the first block and the second block,
   information of a plurality of internal nets, each internal net from the plurality of internal nets connecting a first component and a second component, wherein the first component and the second component belong to the first plurality of block components or the second plurality of block components, and wherein said each internal net is associated with a block-level net designator, and
   information of a plurality of external nets, each external net from the plurality of external nets connecting a component from the first plurality of block components or the second plurality of block components to a connector from the connectors of the at least one connector;
   automatically generating a design of a merged block of the circuit, the design comprising:
   a plurality of circuit components, comprising the first plurality of block components and the second plurality of block components, wherein each component of the plurality of circuit components is associated with a unique designator and an association to a respective block-level designator,
   a plurality of internal circuit nets comprising the plurality of internal nets, wherein each internal circuit net of the plurality of internal circuit nets is associated with a unique net designator and an association to a respective block-level net designator, and
   a plurality of combined circuit nets based on the plurality of external nets, each combined circuit net of the plurality of combined circuit nets based on a first external net and a second external net from the plurality of external nets, wherein the first external net connects at least one component from the first block to at least one pin of the at least one connector, and the second external net connects at least one component from the second block to the at least one corresponding pin of the at least one connector, each combined circuit net thereby connecting the at least one component from the first block and the at least one component from the second block, each combined circuit net associated with a unique net designator and an association to the first external net and the second external net;
   testing the design of the circuit based on the plurality of circuit components, the plurality of internal circuit nets and the plurality of combined circuit nets, said testing comprising an electric simulation, a design rules checking and a connectivity verification; and
   outputting results of a schematic verification and the electric simulation.

2. The method of claim 1, wherein the generating the design comprises:
   receiving merging parameters for the first block and the second block;
   receiving merging indications for the connectors;
   generating the plurality of circuit components, each circuit component of the plurality of circuit components associated with a component from the first block or the second block; and
   generating the plurality of internal circuit nets and the plurality of combined circuit nets, each internal circuit net of the plurality of internal circuit nets connecting two components from the first block or two components from the second block, and each external circuit net of the plurality of external circuit nets connecting a component of the first block with a component of the second block through a connector from the connectors.

3. The method of claim 1, wherein the unique designator of a component from the plurality of circuit components comprises a name of a block the component belongs to, and the block-level designator of the component.

4. The method of claim 1, wherein the unique designator comprises a predefined character separator.

5. The method of claim 1, wherein the unique net designator of a net from the plurality of internal circuit nets comprises a name of a block the net belongs to, and the block-level net designator.

6. The method of claim 1, wherein the unique net designator of a net from the plurality of internal circuit nets comprises a predefined character separator.

7. The method of claim 1, wherein the unique net designator of a net from the plurality of combined circuit nets comprises a designator of the first external net and a designator of the second external net.

8. The method of claim 1, wherein the unique net designator of a net from the plurality of combined circuit nets comprises a predefined character separator.

9. The method of claim 1, wherein further blocks are added incrementally to the design of the circuit.

10. An apparatus having a processor and a memory device, the processor being adapted to perform steps of:
    obtaining information of a circuit being designed, the circuit comprising at least a first block and a second block, the information comprising:
    information of a first plurality of block components of the first block and of a second plurality of block components of the second block, each component of the first plurality of block components and the second plurality of block components associated with a block-level designator, information of at least one connector connecting the first block and the second block, information of a plurality of internal nets, each internal net from the plurality of internal nets connecting a first component and a second component, wherein the first component and the second component belong to the first plurality of block components or the second plurality of block components, and wherein each said internal net is associated with a block-level net designator, and information of a plurality of external nets, each external net from the plurality of external nets connecting a component from the first plurality of block components or the second plurality of block components to a connector from connectors of the at least one connector;

automatically generating a design of a merged block of the circuit, the design comprising:

a plurality of circuit components, comprising the first plurality of block components and the second plurality of block components, wherein each component of the plurality of circuit components is associated with a unique designator and an association to a respective block-level designator, a plurality of internal circuit nets comprising the plurality of internal nets, wherein each internal circuit net of the plurality of internal circuit nets is associated with a unique net designator and an association to a respective block-level net designator, and a plurality of combined circuit nets based on the plurality of external nets, each combined circuit net of the plurality of combined circuit nets based on a first external net and a second external net from the plurality of external nets, wherein the first external net connects at least one component from the first block to at least one pin of the at least one connector, and the second external net connects at least one component from the second block to the at least one corresponding pin of the at least one connector, each combined circuit net thereby connecting the at least one component from the first block and the at least one component from the second block, each combined circuit net associated with a unique net designator and an association to the first external net and the second external net;

testing the design of the circuit based on the plurality of circuit components, the plurality of internal circuit nets and the plurality of combined circuit nets, said testing comprising an electric simulation, a design rules checking and a connectivity verification; and outputting results of a schematic verification and the electric simulation.

11. The apparatus of claim 10, wherein the step of generating the design comprises:

receiving merging parameters for the first block and the second block;

receiving merging indications for the connectors;

generating the plurality of circuit components, each circuit component of the plurality of circuit components associated with a component from the first block or the second block; and generating the plurality of internal circuit nets and the plurality of combined circuit nets, each internal circuit net of the plurality of internal circuit nets connecting two components from the first block or two components from the second block, and each external circuit net of the plurality of external circuit nets connecting a component of the first block with a component of the second block through a connector from the connectors.

12. The apparatus of claim 10, wherein the unique designator of a component from the plurality of circuit components comprises a name of a block the component belongs to, and the block-level designator of the component.

13. The apparatus of claim 10, wherein the unique designator comprises a predefined character separator.

14. The apparatus of claim 10, wherein the unique net designator of a net from the plurality of internal circuit nets comprises a name of a block the net belongs to, and the block-level net designator.

15. The apparatus of claim 10, wherein the unique net designator of a net from the plurality of internal circuit nets comprises a predefined character separator.

16. The apparatus of claim 10, wherein the unique net designator of a net from the plurality of combined circuit nets comprises a designator of the first external net and a designator of the second external net.

17. The apparatus of claim 10, wherein the unique net designator of a net from the plurality of combined circuit nets comprises a predefined character separator.

18. The apparatus of claim 10, the steps are repeated for incrementally adding further blocks to the design of the circuit.

19. A computer program product comprising a non-transitory computer readable medium retaining program instructions, which instructions when read by a processor, cause the processor to perform a method comprising:

obtaining information of a circuit being designed, the circuit comprising at least a first block and a second block, the information comprising:

information of a first plurality of block components of the first block and of a second plurality of block components of the second block, each component of the first plurality of block components and the second plurality of block components associated with a block-level designator, information of at least one connector connecting the first block and the second block, information of a plurality of internal nets, each internal net from the plurality of internal nets connecting a first component and a second component, wherein the first component and the second component belong the first plurality of block components or the second plurality of block components, and wherein said each internal net is associated with a block-level net designator, and information of a plurality of external nets, each external net from the plurality of external nets connecting a component from the first plurality of block components or the second plurality of block components to a connector from the connectors of the at least one connector;

automatically generating a design of a merged block of the circuit, the design comprising:

a plurality of circuit components, comprising the first plurality of block components and the second plurality of block components, wherein each component of the plurality of circuit components is associated with a unique designator and an association to a respective block-level designator, a plurality of internal circuit nets comprising the plurality of internal nets, wherein each internal circuit net of the plurality of internal circuit nets is associated with a unique net designator and an association to a respective block-level net designator, and a plurality of combined circuit nets based on the plurality of external nets, each combined circuit net of the plurality of combined circuit nets based on a first external net and a second external net from the plurality of external nets, wherein the first external net connects at least one component from the first block to at least one pin of the at least one connector, and the second external net connects at least one component from the second block to the at least one corresponding pin of the at least one connector, each combined circuit net thereby connecting the at least one component from the first block and the at least one component from the second block, each combined circuit net associated with a unique net designator and an association to the first external net and the second external net;

testing the design of the circuit based on the plurality of circuit components, the plurality of internal circuit nets and the plurality of combined circuit nets, said testing comprising an electric simulation, a design rules checking and a connectivity verification; and outputting results of a schematic verification and the electric simulation.

\* \* \* \* \*